United States Patent
Ido et al.

(10) Patent No.: US 7,557,744 B2
(45) Date of Patent: Jul. 7, 2009

(54) PWM DRIVER AND CLASS D AMPLIFIER USING SAME

(75) Inventors: Toru Ido, Kanagawa (JP); Soichiro Ishizuka, Kanagawa (JP)

(73) Assignee: Texas Instruments Incorporated, Dallas, TX (US)

( * ) Notice: Subject to any disclaimer, the term of this patent is extended or adjusted under 35 U.S.C. 154(b) by 79 days.

(21) Appl. No.: 11/263,453

(22) Filed: Oct. 31, 2005

(65) Prior Publication Data

US 2006/0092063 A1   May 4, 2006

(30) Foreign Application Priority Data

Nov. 1, 2004  (JP)  ............... 2004-318114

(51) Int. Cl.
  *H03M 1/82* (2006.01)
(52) U.S. Cl. ....................... 341/152; 330/10
(58) Field of Classification Search ............ 341/152, 341/110, 143; 330/10
  See application file for complete search history.

(56) References Cited

U.S. PATENT DOCUMENTS

| | | | | |
|---|---|---|---|---|
| 4,772,873 A | * | 9/1988 | Duncan | ............ 341/110 |
| 5,376,872 A | * | 12/1994 | Hara | ............ 318/799 |
| 6,653,799 B2 | * | 11/2003 | Cammack | ............ 315/224 |
| 6,967,607 B2 | * | 11/2005 | Melanson | ............ 341/143 |
| 7,453,316 B2 | * | 11/2008 | Shimizu | ............ 330/10 |

OTHER PUBLICATIONS

Philips, Kathleen, et al., "PowerDAC: A Single-Chip Audio DAC with a 70% Efficient Power Stage in 0.5Um CMOS", In IEEE ISSCC Dig. Tech Papers, 1999, pp. 154-155.
Gaalaas, Eric, et al., "Integrated Stereo Delta-Sigma Class D Amplifier", in IEEE ISSCC Dig. Tech Papers 2005, pp. 120-121.

* cited by examiner

*Primary Examiner*—Rexford Barnie
*Assistant Examiner*—Joseph Lauture
(74) *Attorney, Agent, or Firm*—John J. Patti; Wade J. Brady, III; Frederick J. Telecky, Jr.

(57) ABSTRACT

The objective of the invention is to provide a class D amplifier that can reduce aliasing noise. The class D amplifier has D/A converter 10 that operates at the first sampling frequency, and PWM driver 3 that receives the output from D/A converter 10. Said PWM driver 3 operates at the second sampling frequency synchronized to the first sampling frequency. The second sampling frequency can be correlated to the delta wave frequency of the PWM driver. Also, synchronization of said first sampling frequency and said second sampling frequency can be carried out with one of said frequencies being an integer multiple of the other.

10 Claims, 5 Drawing Sheets

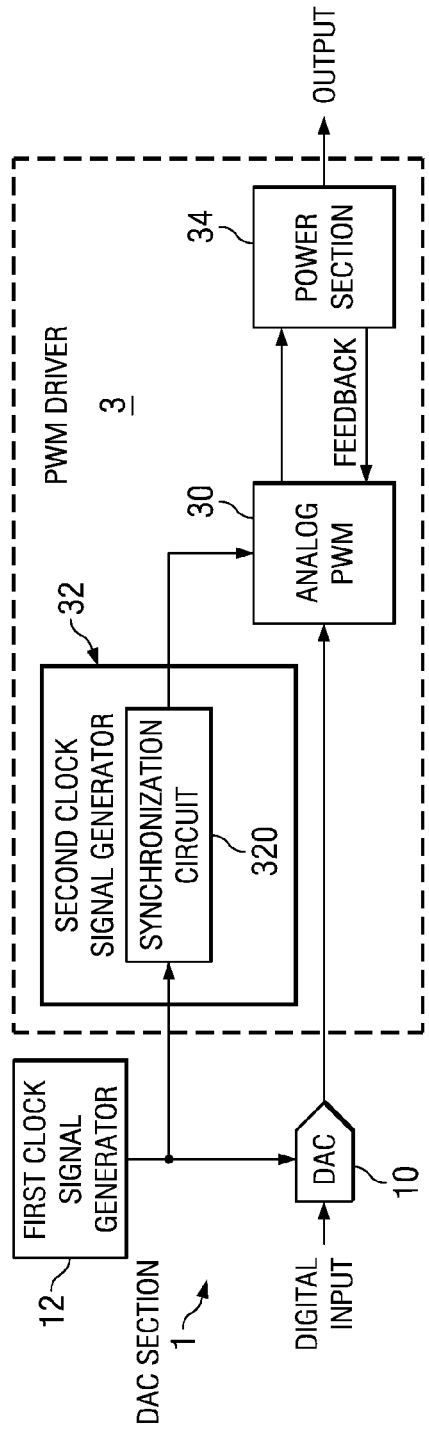
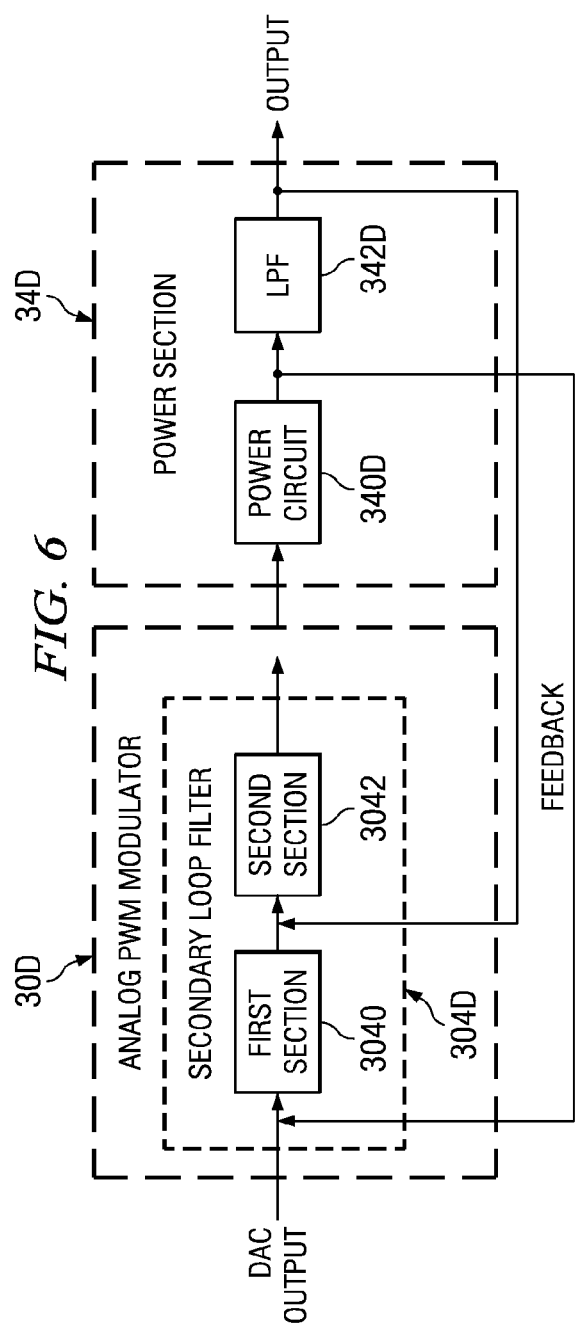

DIGITAL INPUT (8fs)

OUTPUT OF DAC 104B (32fs)

OUTPUT OF PWM MODULATOR 30B (16fs)

PWM DRIVER AND CLASS D AMPLIFIER USING SAME

CROSS REFERENCE TO RELATED APPLICATIONS

This application claims priority under 35 USC § 119 of Japanese Application Serial No. 2004-318114, filed Nov. 1, 2004.

FIELD OF THE INVENTION

The present invention pertains to a PWM driver and a class D amplifier using it.

BACKGROUND OF THE INVENTION

Various methods have been proposed to realize class D amplifiers (so-called digital amplifiers). Generally speaking, there are the method for realizing a digital system and the method for realizing an analog system. FIG. 7 is a diagram illustrating an example of the digital system. The design of the digital system is as follows: the input digital signal is usually oversampled, followed by ΔΣ modulation, and the obtained parallel multi-bit signal is converted by a digital/pulse-width modulator (digital PWM) to a 1-bit pulse-width modulation signal. In this way, a signal for driving the power section as the amplification section is obtained.

For the class D amplifier of the digital system, if the power section is an ideal switch, it is possible to realize the performance determined by the digital circuit up to the stage of the power section. However, the actual power section has several nonideal elements, so that in a real circuit, the performance of the class D amplifier is limited to the characteristics of the power section. Consequently, no matter how much the signal processing performance for a digital class D amplifier is improved, it is still impossible to realize performance better than the characteristics of the power section contained in the class D amplifier.

FIG. 8 is a diagram illustrating an example of an analog class D amplifier. In this analog system, an analog PWM circuit is used instead of the digital PWM, and the feedback from the output of the power section to the analog PWM circuit is used, so that the influence from nonideal elements of the power section is reduced, and, as a result, the performance of the class D amplifier can be significantly improved.

However, because the analog PWM circuit requires an analog input signal, a digital/analog converter is needed when handling the digital signals from CDs and DVDs, which have become the principal signal sources in recent years, as shown in the figure. Also, many digital/analog converters (DAC have noise outside the signal bandwidth, and, in order to remove the noise, as shown in the figure, it is necessary to insert a post low-pass filter (LPF) after the DAC. Because cutoff characteristics down to a very low band are needed for the low-pass filter, it is not easy to integrate the LPF in the IC circuit.

L. Risbo, T. Morch, *Performance of an all-digital power amplification system*, 104th Audio Engineering Society Convention, Amsterdam, pre print 4695.

1: Rudy J. Van de Plassche, *"Dynamic element matching for high-accuracy monolithic D/A converters,"* IEEE J. Solid-State Circuits, vol. SC-11, pp. 795-800, December 1976.

2: L. Richard Carley, *"A noise-shaping coder topology for 15+ bi converters,"* IEEE J. Solid-State Circuits, vol. SC-24, pp. 267-273, 1989.

3: Bosco H. Leung, *"Architectures for multi-bit oversampled A/D converter employing dynamic element matching techniques,"* IEEE ISCAS 1991, pp. 1657-1660.

SUMMARY OF THE INVENTION

Consequently, the objective of the present invention is to provide a PWM driver.

Another objective of the present invention is to provide a class D amplifier using said PWM driver.

The other objectives of the present invention will be explained in the following.

The present invention provides a class D amplifier characterized by the fact that the class D amplifier is composed of the following parts: a) a D/A converter that operates at the first sampling frequency, and b) a PWM driver that receives the output of said D/A converter, and this PWM driver operates at the second sampling frequency synchronized to said first sampling frequency.

According to the present invention, said second sampling frequency may be correlated to the delta wave frequency of said PWM driver. Said delta frequency may be ½ said second sampling frequency. Synchronization between said first sampling frequency and said second sampling frequency may be carried out such that one is an integer multiple of the other. Said integer-multiple relationship may be a 1:1 relationship.

Said PWM driver may have a PWM modulator and a power section that receives the output from said PWM modulator. Also, said PWM driver may have a feedback loop from the output of said power section to said PWM modulator.

Also, the present invention provides a PWM driver characterized by the fact that the PWM driver has the following parts: a) a clock generator that generates a clock signal, which determines the second sampling frequency synchronized to the first sampling frequency related to the input signal received by the PWM driver, and b) a PWM modulator that receives said input signal and operates at the second sampling frequency determined by said clock.

According to the present invention, the PWM driver may also contain a power section that receives the output from said PWM modulator. Also, said PWM modulator may have a feedback loop that feeds back the output of said power section to said PWM modulator.

BRIEF DESCRIPTION OF THE DRAWINGS

FIG. 1 is a block diagram illustrating the class D amplifier in one embodiment of the present invention.

FIG. 6 is a block diagram illustrating different embodiment of the PWM driver portion from that shown in FIGS. 1, 2 and 5.

Figure 2:
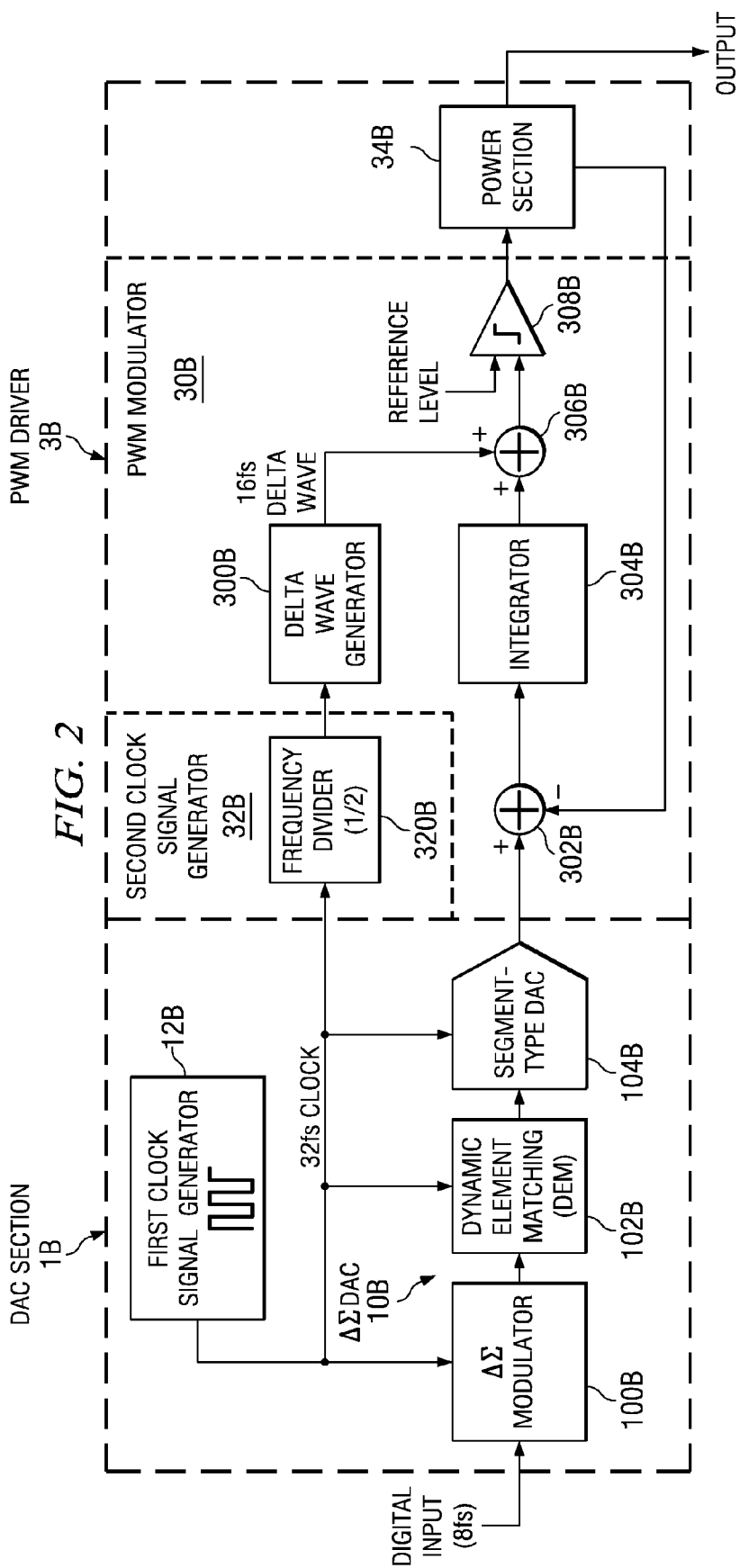
FIG. 2 is a block diagram illustrating the class D amplifier in an embodiment that further specifies the class D amplifier shown in FIG. 1.

REFERENCE NUMERALS AND SYMBOLS AS
SHOWN IN THE DRAWINGS

In the FIGS. 1, 1B, 1C, represent a DAC part; 3, 3B, 3C, 3D represent a PWM driver, 12, 12B, 12C, 12D, represent a first clock signal generator; 32, 32B, 32C, 32D, represent a second clock signal generator.

DETAILED DESCRIPTION OF THE DRAWINGS

According to the present invention, it is possible to reduce the noise in the PWM modulator because the sampling frequency of the PWM driver in the class D amplifier is synchronized to the sampling frequency related to the input signal from another circuit of the class D amplifier that receives the PWM driver.

In the following, a detailed explanation will be given regarding several embodiments of the present invention, with reference to figures.

With respect to FIG. 1, a class D amplifier A in an embodiment of the present invention can be explained. Generally speaking, class D amplifier A is composed of D/A conversion section DAC 1 and PWM (pulse-width modulation) driver 3. Said DAC section 1 has DAC 10 and first clock signal generator 12. On the other hand, PWM driver 3 has analog PWM modulator 30, second clock signal generator 32 that generates the second clock signal, and power section 34.

More specifically, DAC 10 may be any type of DAC. It has an input that receives the digital input signal and it receives the first clock signal from first clock signal generator 12. Since it operates at the sampling frequency determined by the first clock signal, the received digital input signal is subjected to D/A conversion, and, as a result, an output is generated. The output is subjected to D/A conversion in the $0^{th}$-order hold signal state for output. Also, in the case of DAC 10, the sampling frequency does not refer to the frequency for sampling the analog signal, and the digital signal means the frequency that dominates the processing for converting the digital signal to an analog signal. Consequently, the output of DAC 10 contains the frequency component depending on the sampling frequency determined by first clock signal generator 12.

On the other hand, analog PWM modulator 30 of PWM driver 3 has an input for receiving the D/A conversion output from DAC 10. It also has an input for receiving the clock signal from second clock signal generator 32. Said second clock signal generator 32 is composed of synchronizing circuit 320 as shown in this figure. This circuit has an input for directly receiving the first clock signal from first clock signal generator 12, and as its output it generates, a second clock signal synchronized to said first clock signal. This synchronization circuit may simply connect the output of first clock signal generator 12 directly to analog PWM modulator 30, or it may have a structure incorporating a frequency divider or multiplier. Said analog PWM modulator 30 that receives said second clock signal uses the frequency determined by the frequency of the second clock signal, and it executes the pulse-width modulation in response to the output of DAC 10. As a result, a pulse-width modulation signal is generated. For this pulse-width modulation signal, the input is received by power section 34, and said power section 34 performs power amplification of the pulse-width modulation signal and outputs it for driving a speaker or other load. From this power section 34, as shown in this figure, a feedback connection is set to analog PWM modulator 30. As a result, it is possible to reduce the influence of the nonideal elements in the power section, and to improve the overall performance of the class D amplifier.

Figure 8:
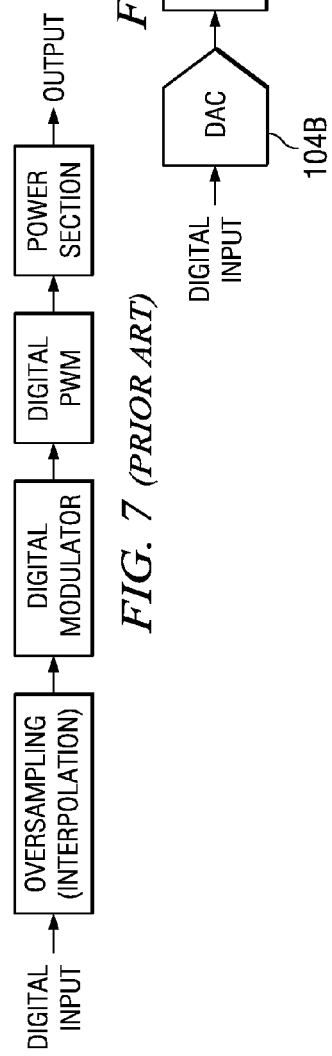
FIG. 8 is a block diagram illustrating the analog class D amplifier in the prior art.

For class D amplifier A shown in FIG. 1, the synchronization of the sampling frequency between DAC part 1 and PWM driver 3 is realized in that synchronizing circuit 320 of PWM driver 3 directly receives the first clock signal of first clock signal generator 12 in DAC part 1. In said synchronizing circuit 320, the received first clock signal is output directly, or after frequency division or frequency multiplication, as the second clock signal. In PWM modulator 30 that receives the second clock signal, a delta wave is generated at a frequency corresponding to the second clock signal frequency. The frequency of the delta wave determines the sampling frequency in said analog PWM modulator 30. Consequently, by incorporating second clock signal generator 32 shown in FIG. 1, in analog PWM modulator 30 that receives the output of DAC 10, it is possible to eliminate generation of aliasing noise or to minimize its generation. As a result, the DAC output containing the noise outside the signal bandwidth can be directly fed to the downstream PWM driver without going through an output buffer or a low-pass filter. As a result, there is no need to have a downstream LPF that requires the conventional circuit design shown in FIG. 8. As a result, it is easy to integrate class D amplifier A.

In the following, an explanation will be given regarding class D amplifier B in the first embodiment that further specifies class D amplifier A shown in FIG. 1. In FIG. 2, the elements corresponding to those elements of FIG. 1 are denoted by attaching "B" after each part number. Class D amplifier B shown in FIG. 2 contains ΔΣ-type DAC in DAC section 1B, and a circuit containing one stage of the integrator is used as the PWM modulator in PWM driver 3B. More specifically, DAC section 10B of class D amplifier B has ΔΣ-type DAC 10B and first clock signal generator 12B. Said ΔΣ-type DAC 10B has the conventional circuit design. As an example, it is composed of ΔΣ modulator 100B that receives the digital input, dynamic element-matching (DEM) circuit 102B, and segment-type DAC 104B composed of said DEM circuit 102B.

Segment-type DAC 104B is a circuit that has plural segments arranged in parallel to generate uniform weights. ΔΣ-type DAC 10B with such design is connected to receive a 32 fs clock signal from first clock signal generator 12B. Here, fs is the sampling frequency related to the digital signal received by ΔΣ modulator 100B from the outside. In order to generate the 32× over-sampling output by ΔΣ-type DAC 10B, first clock signal generator 12B generates the 32 fs clock signal. Also, in the explanation of this embodiment, the digital input received by ΔΣ modulator 100B is the digital signal with 8× (8 fs) oversampling from the digital signal processor (DSP), not shown in the figure (here, fs refers to the sampling frequency of the original digital signal received by the DSP). As a result, the digital input signal is further subjected to 4× oversampling and modulation in ΔΣ modulator 100B, and it is input via DEM circuit 102B to segment-type DAC 104B. DAC 104B outputs the signal after D/A conversion as the 32× 32 fs) oversampled signal. The D/A converted signal is the signal that contains the noise outside the signal bandwidth.

On the other hand, PWM driver 3B has analog PWM modulator 30B, second clock signal generator 32B and power section 34B. More specifically, second clock signal generator 32B is composed of ½ frequency divider 320B. It receives a 32 fs clock signal from first clock signal generator 12B, and generates and outputs a 16 fs clock signal as the result of frequency-division. Also, analog PWM modulator 30B has delta wave generator 300B, subtractor 302B, integrator 304B, adder 306B and comparator 308B. Said subtractor 302B receives the output of segment-type DAC 104B at one of its two inputs, and receives the feedback output from power section 34B at its other input. It then subtracts one input from the other input, and generates and outputs the subtraction result. This feedback connection has the effect that the influence of the nonlinear elements in said power section 34B can be eliminated or reduced. Then, the integrator that receives the output from the subtractor generates and outputs integration of the input. This is applied to one of two inputs of adder 306B. On the other hand, delta wave generator 300B receives the 16 fs clock signal from frequency divider 320B with its input, and generates and outputs a delta wave at a frequency of 16 fs, that is, ½ said 32 fs. Here, in the pulse-width modulation, two sampling cycles take place during each period of the delta wave. Consequently, the 16 fs delta wave corresponds to the sampling frequency of the 32 fs. The delta wave is applied to the other input of adder 306B. As a result, the adder generates the sum of the output of the integrator and the delta wave as its output. Comparator 308B receives the output of the adder as one of its inputs, and it receives the reference level value as its other input. When the output of the adder is larger than the reference level value, a HIGH output is generated, if not, a LOW output is generated. The output of the integrator becomes the pulse-width modulation signal. Also, in said analog PWM modulator 30B, the circuit design is such that after the output of the integrator and the delta wave are added, the sum is compared to the reference level to form the pulse-width modulation signal. However, one may also adopt other well-known circuit designs. The pulse-width modulation signal formed in this way is subjected to power amplification by power section 34B, and is output. This power section may be formed from any well-known class D driver. The output of the power section is sent to the load to be driven by the class D amplifier. Also, the output of the power section may be used as the feedback output from power section 34B to subtractor 302B.

Figure 3A:
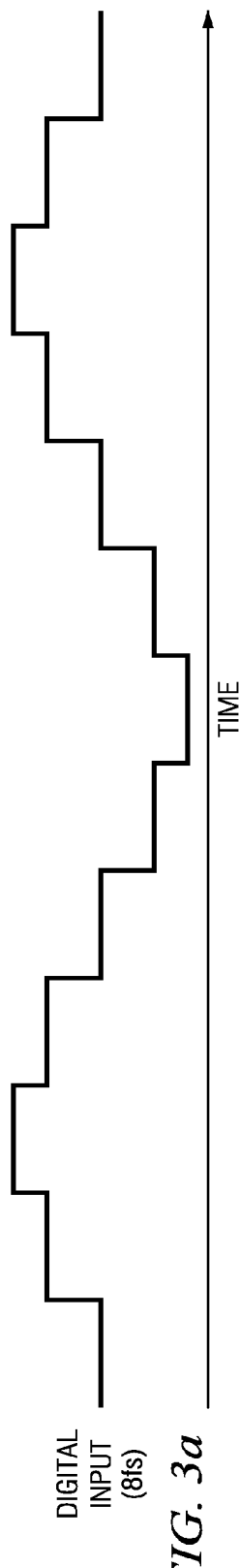
FIG. 3 is a waveform diagram illustrating the waveform of the signal in the class D amplifier shown in FIG. 2.
Figure 3B:
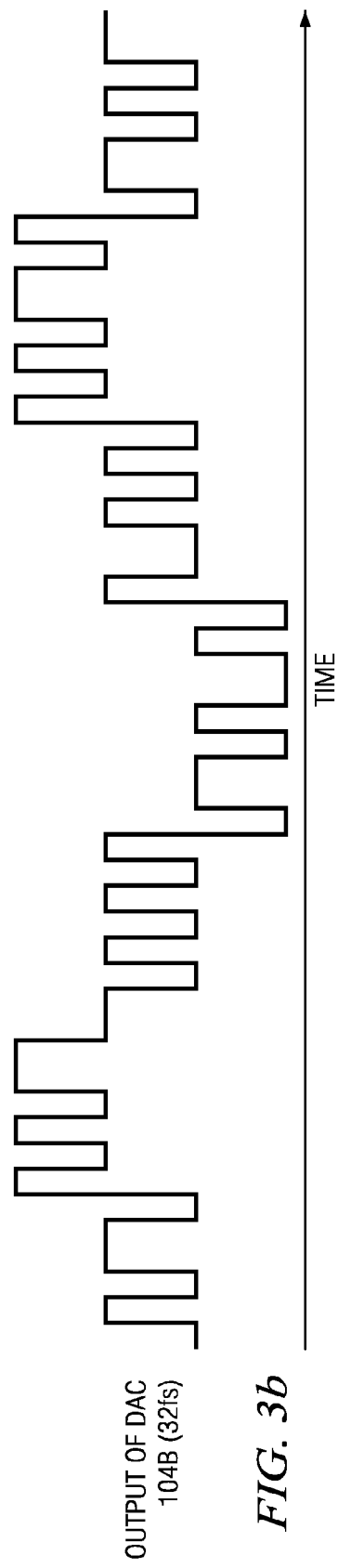
Figure 3C:
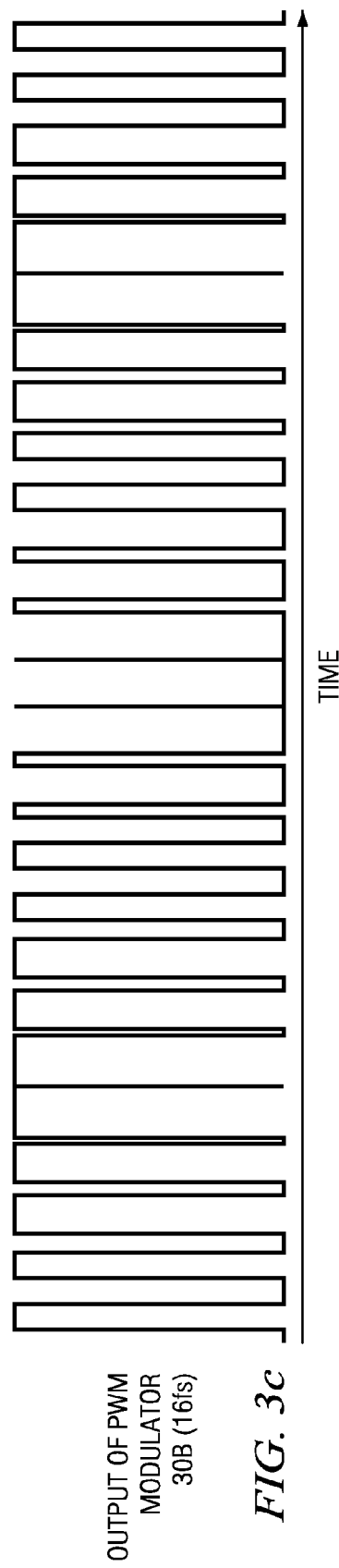
Figure 4A:
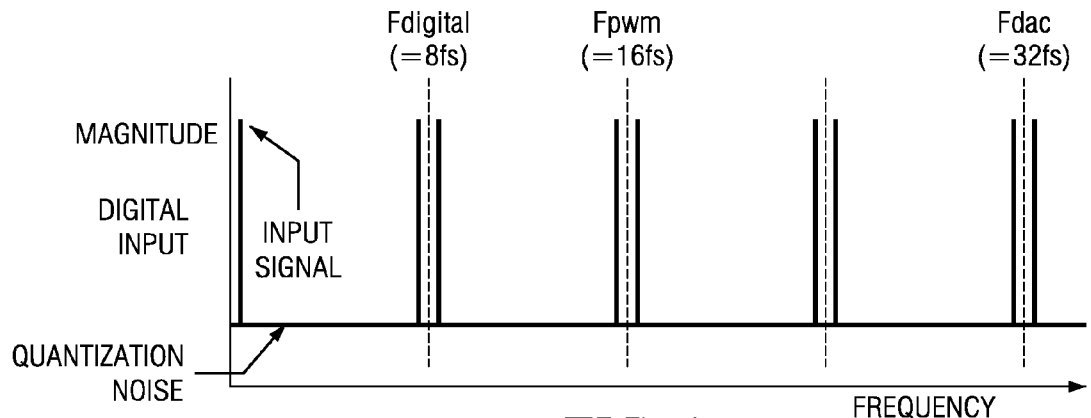
FIG. 4 is a diagram illustrating the signal frequency spectrum in the class D amplifier shown in FIGS. 2 and 3.
Figure 4B:
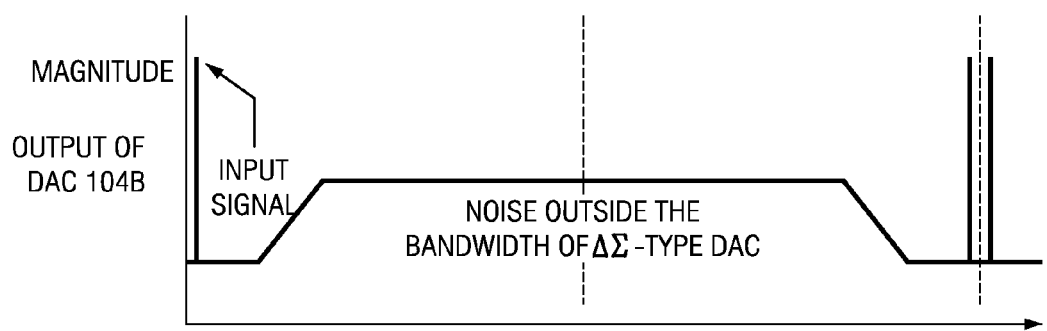
Figure 4C:
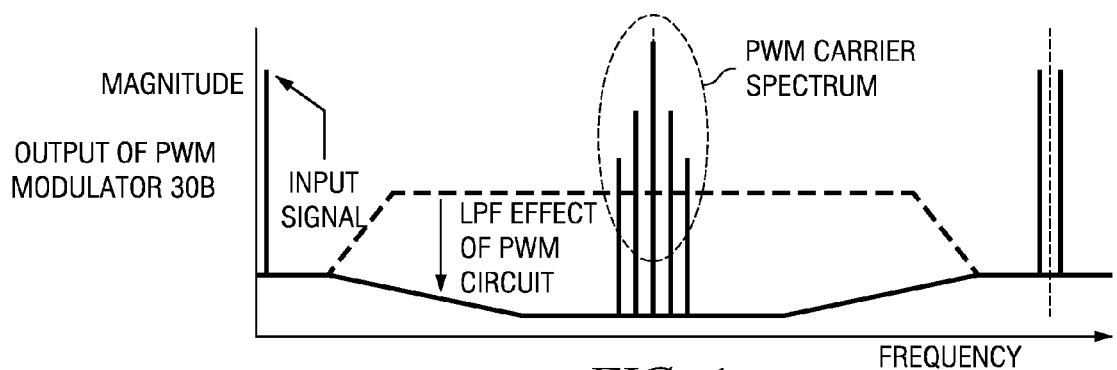

In the following, a detailed explanation will be given of the operation of class D amplifier B shown in FIG. 2. FIG. 3 shows the waveforms of the digital input received by ΔΣ-type DAC 10B (FIG. 3(a)), the output of segment DAC 104B (FIG. 3(b)), and the output of PWM modulator 30B (FIG. 3(c)). As can be seen from FIG. 3, according to the flow of signals of the digital input, DAC part, and PWM driver part, the resolution in the amplitude direction of the signal (ordinate of the graph) and the resolution in the direction of the time axis are increased. Finally, the output of PWM modulator 30B (and also the output of power section 34B) becomes a continuous signal in the direction of the time axis. FIG. 4 shows the frequency spectra of the digital input (FIG. 4(a)), the DAC output (FIG. 4(b)), and the PWM modulator output (FIG. 4(c)). Usually, for example, in the case of an audio signal, the digital input signal is a 24-bit signal at 48 kHz (corresponding to fs). It is converted to a 6-bit signal at 1.536 MHz (corresponding to 32 fs) at the output of DAC section 1B, and, finally, it becomes a PWM signal at 768 kHz (corresponding to 16 fs).

As can be seen from FIG. 3, the digital input is a multi-bit digital signal, and it has a sampling frequency of 8 fs (also denoted as Fdigital). In order to facilitate understanding, the digital input signal is shown here as a $0^{th}$-order held state. In practice, however, it is a discrete binary signal. As shown in FIG. 4(a), this digital input signal itself also has harmonic components at the integer positions of sampling frequency Fdigital. As shown in FIG. 3(b), the DAC output generated by ΔΣ-type DAC 10B from said digital input signal goes through the 4× over-sampling treatment. Consequently, the sampling frequency becomes higher than that shown in FIG. 3(a). As a result, it becomes the sampling frequency of 32 fs (also denoted as Fdac). Similarly, in FIG. 3(b), the $0^{th}$ order held state is shown for the waveform as well in order to facilitate understanding. However, in practice, it is a discrete multi-bit binary signal. As shown in FIG. 4(b), the frequency spectrum of the DAC output has noises outside of the signal bandwidth between the input source bandwidth and the over-sampling frequency.

Then, in the output of PWM modulator 30B, as shown in FIG. 3(c), the noise outside of the signal bandwidth in the frequency region between the signal bandwidth and Fdac is attenuated, and, together with this attenuation, a frequency spectrum appears due to PWM modulation in the frequency region near delta wave frequency Fpwm. In this case, sampling frequency Fdac of DAC 10B and the sampling frequency of PWM modulator 30B are synchronized to each other, so that no aliasing noise is generated due to sampling caused by pulse-width modulation in the PWM modulator.

More specifically, when aliasing noise becomes a problem, a signal having a component in the band ½ or higher the sampling frequency may usually be sampled. Because the image component is near the integer position of the sampling frequency, it is usually necessary to remove the image component by means of a filter in order to realize sampling of the sampled signal once again at a different frequency. Consequently, in the conventional analog circuit shown in FIG. 8, it is necessary to have a downstream LPF. However, in this embodiment, the noise outside of the signal bandwidth generated in DAC 104B is attenuated or removed by means of the low-pass characteristics of integrator 304B having feedback contained in PWM modulator 30B, and, while the noise outside of the signal bandwidth has been reduced, pulse-width modulation is carried out. Here, delta wave frequency Fpwm is ½ the value of Fdac. However, as explained above, the generated sampling takes place at a rate twice the period of the delta wave in the PWM modulation. Consequently, sampling frequency Fpwms in the PWM modulator is equal to twice Fpwm, and it is in agreement with Fdac (Fpwms=2× Fpwm=Fdac). As a result of said sampling frequency synchronization, no aliasing noise is generated as explained above.

Figure 5:
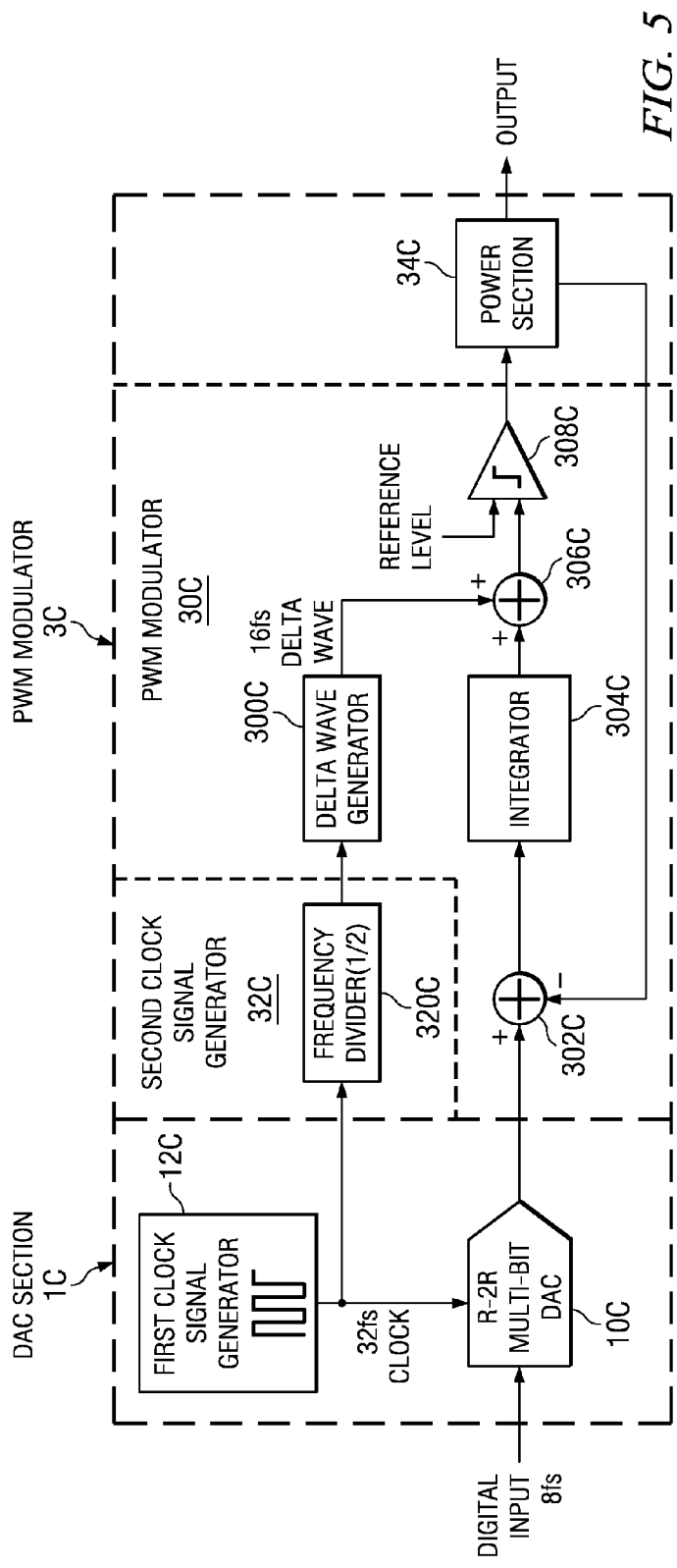
FIG. 5 is a block diagram illustrating different embodiment from that shown in FIG. 2 and further specifies the class D amplifier shown in FIG. 1.
Figure 7:
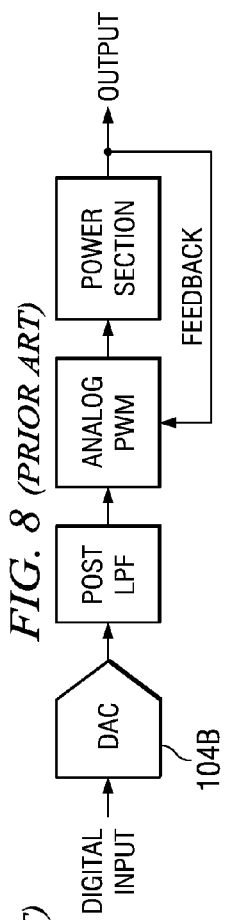
FIG. 7 is a block diagram illustrating the digital class D amplifier in the prior art.

In the following, an explanation will be given regarding class D amplifier C in an embodiment other than the embodiment shown in FIG. 2 as a more specific form of class D amplifier A shown in FIG. 1. In FIG. 5, a "C" is appended to all part numbers to distinguish them from those in FIGS. 1 and 2. As can be seen from this figure, class D amplifier C shown in FIG. 5 is similar to class D amplifier B shown in FIG. 2. It differs from that shown in FIG. 2 in that the DAC contained in DAC 1C is an R-2R multi-bit type DAC 10C as another type of ΔΣ-type DAC. The other features are the same. That is, DAC part 1C also contains first clock signal generator 12C that generates 32 fs clock signal and PWM driver 3C has second clock signal generator 32C (composed of frequency divider 320C), analog PWM modulator 30C (containing delta wave generator 300C that generates 16 fs delta waves, subtractor 302C, integrator 304C, adder 306C, and comparator 308C), and power section 34C. That is, as shown in FIG. 5, R-2R multi-bit type DAC 10C of class D amplifier C has a well-known circuit design, it is DAC that performs 4× oversampling, and it has an R-2R ladder network. It outputs the analog signal with noise outside the bandwidth just as ΔΣ-type DAC. In this embodiment using said DAC, it is also possible to obtain the effect of removing or reducing the aliasing noise by means of synchronization between DAC part 1C and PWM driver 3C at the sampling frequency.

With reference to FIG. 6, an explanation will be given below regarding PWM driver 3D as another embodiment of the PWM driver portion shown in FIGS. 1, 2 and 5. Similarly, "D" is appended to the part numbers to distinguish them from the corresponding elements shown in FIGS. 1, 2 and 5. Also, as shown in FIG. 6, the elements corresponding to second clock signal generator 32, second clock signal generator 32, etc., shown in FIGS. 1, 2 and 5 are not shown in the figure. In FIG. 6, a specific example of the feedback from the power section to the analog PWM modulator in the PWM driver is shown. More specifically, PWM driver 3D contains analog PWM modulator 30D and power section 34D. For example, as shown in FIG. 2, PWM modulator 30D has secondary loop filter 304C instead of a combination of subtractor 302B and integrator 304B. It also has a delta wave generator, an adder, and a comparator (not shown in the figure). Also, power section 34D has low-pass filter (LPF) 342D connected to the output side in addition to power circuit 340D. The output of the low-pass filter can be connected to the speaker or other load.

In this embodiment, feedback from power section 34D to PWM modulator 30D makes use of two outputs, that is, the output of power circuit 340D and the output of LPF 342D. Also, in the embodiment shown in FIGS. 1, 2 and 5, the input position of the output of the power section to the integrator is selected as the circuit position of the feedback destination. In the present embodiment, on the other hand, the plural different positions in PWM modulator 30D can be selected. For example, in the embodiment shown in FIGS. 1, 2 and 5, one integrator stage is used. The present embodiment, as shown in the figure, uses secondary loop filter 304C composed of two filter sections 3040 and 3042 connected in tandem instead of the one-stage integrator. Consequently, the output of power circuit 340D is input in this embodiment to first filter section 3040, and the output of LPF 342D is fed back to the input of second filter section 3042. As a result, the influence of the nonlinear elements in the power section can be further reduced (more specifically, for example, there is the effect that the nonlinear element of the LPF also can be reduced. By means of double feedback, it is possible to realize the effect of appropriate reduction for both the power circuit and the LPF). In addition, a secondary loop filter is used in this embodiment. However, it is also possible to make use of even higher-order loop filters. In this case, it is possible to select the combination of the feedback signals for the feedback and the position of the feedback destination circuit so as to realize the optimum performance.

In the various embodiments explained in detail above, a frequency divider with a ½ frequency dividing ratio has been explained in detail as the method for realizing synchronization. However, synchronization between the sampling frequencies can be realized by means of an integer-multiple relationship in addition to the case in which the frequencies are made equal to each other. Consequently, in the embodiment shown in FIGS. 2 and 5, it is possible to select the frequency division ratio of the frequency divider at a value other than ½. For example, it may be changed to 2×, 3×, etc. In such a case, it is still possible to reduce or eliminate the aliasing noise. In addition, in the aforementioned embodiment, explanation was made for the case when the PWM modulator makes use of a delta wave as an example. However, it is also possible to make use of waveforms other than said delta wave, such as a sawtooth wave. In the case of a sawtooth wave, sampling does not take place once a period. Consequently, the frequency dividing ratio or multiple ratio should be adjusted. In addition, from the viewpoint of reduction of the aliasing noise, it is possible to use a multiplier instead of a frequency divider.

The invention claimed is:

1. A class D amplifier comprising:
   a first clock generator that outputs a first clock signal having a first frequency;
   a digital-to-analog converter (DAC) that receives an input signal and the first clock signal, wherein the DAC operates on the first frequency;
   a pulse-width modulation (PWM) driver that receives an output from the DAC, wherein the PWM driver includes a second clock generator that produces a second clock signal having a second frequency, and wherein the PWM driver includes a delta wave generator that receives the second clock signal, and wherein the PWM driver samples the output of the DAC at the second frequency.

2. The class D amplifier of claim 1, wherein the second clock generator further comprises a frequency divider that receives the first clock signal and that generates the second clock signal from the first clock signal.

3. The class D amplifier of claim 1, wherein the PWM driver further comprises:
   an analog PWM that receives the output from the DAC and that receives the second clock signal; and
   a power section that receives an output from the analog PWM and that provides feedback to the analog PWM.

4. The class D amplifier of claim 3, wherein the analog PWM further comprises:
   the delta wave generator that receives the second clock signal and that generates a delta wave signal;
   a subtractor that receives an output from the DAC section and the feedback from the power section, wherein the subtractor subtracts the feedback signal from the output from the DAC;
   an integrator that receives an output from the subtractor;
   an adder that receives the delta wave signal and an output from the integrator; and
   a comparator that receives an output from the adder and compares the output from the adder to a reference.

5. The class D amplifier of claim 1, wherein the class D amplifier further comprises:
   a delta-sigma modulator that operates on the first frequency; and
   a dynamic element-matching circuit that receives an output from the delta-sigma modulator, that operates on the first frequency, and that provide an input for the DAC.

6. The class D amplifier of claim 1, wherein the DAC is an R-2R DAC.

7. A class D amplifier comprising:
   a DAC section having a first generator that produces a first clock signal at a first frequency and having a DAC, wherein the DAC operates on the first frequency;
   a second clock generator that receives the first clock signal and that generates a second clock signal at a second frequency from the first clock signal;
   a delta wave generator that receives the second clock signal and that generates a delta wave signal;
   a subtractor that receives an output from the DAC section;
   an integrator that receives an output from the subtractor;
   an adder that receives the delta wave signal and an output from the integrator;
   a comparator that receives an output from the adder and compares the output from the adder to a reference; and
   a power section that receives an output from the comparator and that provides feedback to the subtractor.

8. The class D amplifier of claim 7, wherein the second clock generator is a frequency divider.

9. The class D amplifier of claim 7, wherein the DAC section further comprises:
- a delta-sigma modulator that operates on the first frequency; and
- a dynamic element-matching circuit that receives an output from the delta-sigma modulator, that operates on the first frequency, and that provide an input for the DAC.

10. The class D amplifier of claim 7, wherein the DAC is an R-2R DAC.

* * * * *